(12) United States Patent
Baird et al.

(10) Patent No.: US 8,188,636 B2
(45) Date of Patent: May 29, 2012

(54) ENERGY GENERATOR SYSTEMS WITH A VOLTAGE-CONTROLLED SWITCH

(75) Inventors: Jason Baird, Rolla, MO (US); Sergey Shkuratov, Lubbock, TX (US)

(73) Assignee: Loki Incorporated, Rolla, MO (US)

( * ) Notice: Subject to any disclaimer, the term of this patent is extended or adjusted under 35 U.S.C. 154(b) by 0 days.

(21) Appl. No.: 13/218,954

(22) Filed: Aug. 26, 2011

(65) Prior Publication Data

US 2012/0019078 A1    Jan. 26, 2012

Related U.S. Application Data

(63) Continuation of application No. 12/711,055, filed on Feb. 23, 2010, now Pat. No. 8,008,843, which is a continuation-in-part of application No. 12/501,729, filed on Jul. 13, 2009, now Pat. No. 7,999,445.

(51) Int. Cl.
*H01L 41/08* (2006.01)
(52) U.S. Cl. .......................... 310/319; 310/339
(58) Field of Classification Search .................. 310/317, 310/319, 316.01
See application file for complete search history.

(56) References Cited

U.S. PATENT DOCUMENTS

| | | | | |
|---|---|---|---|---|
| 6,984,902 | B1 * | 1/2006 | Huang et al. | 310/26 |
| 7,999,445 | B2 * | 8/2011 | Baird et al. | 310/339 |
| 8,008,843 | B2 * | 8/2011 | Baird et al. | 310/339 |

* cited by examiner

*Primary Examiner* — Mark Budd
(74) *Attorney, Agent, or Firm* — Hovey Williams LLP

(57) ABSTRACT

A first energy generating system comprises a ferromagnetic generator coupled to a voltage controlled switch. The ferromagnetic generator includes a ferromagnetic element generating a magnetic field and positioned within a pulse generating coil and near an explosive charge. Detonation of the explosive charge decreases the magnetic field and induces a pulse of electric energy in the pulse generating coil. When the magnitude of the electric energy reaches a certain level, the voltage controlled switch closes. A second energy generating system comprises a flux compression generator coupled to a voltage controlled switch. The flux compression generator includes a inductance coil generating a magnetic field within a metallic armature that includes an explosive charge. Detonation of the explosive charge changes the magnetic field and induces a pulse of electric energy in the inductance coil. When the magnitude of the electric energy reaches a certain level, the voltage controlled switch closes.

13 Claims, 11 Drawing Sheets

ENERGY GENERATOR SYSTEMS WITH A VOLTAGE-CONTROLLED SWITCH

RELATED APPLICATION

The present application is a continuation patent application that claims priority benefit, with regard to all common subject matter, of earlier-filed U.S. Pat. No. 8,008,843, issued Aug. 30, 2011, and entitled "FERROELECTRIC ENERGY GENERATOR WITH VOLTAGE-CONTROLLED SWITCH," which is a continuation-in-part patent application claiming priority benefit, with regard to all common subject matter, of earlier-filed U.S. Pat. No. 7,999,445, issued Aug. 16, 2011, and entitled "FERROELECTRIC ENERGY GENERATOR WITH VOLTAGE-CONTROLLED SWITCH." The identified earlier-filed patents are hereby incorporated by reference in its entirety into the present application.

FEDERALLY SPONSORED RESEARCH OR DEVELOPMENT PROGRAM

The present invention was developed with support from the U.S. government under Contract Nos. W9113M-07-C-0215 and W9113M-08-C-0006 with the U.S. Department of Defense. Accordingly, the U.S. government has certain rights in the present invention.

BACKGROUND OF THE INVENTION

1. Field of the Invention

Embodiments of the present invention relate to energy generator systems. More particularly, embodiments of the present invention relate to energy generators that are explosively driven to deliver electrical energy to a load through a voltage-controlled switch.

2. Description of the Related Art

Explosive-driven pulsed power energy generators, such as ferroelectric energy generators, ferromagnetic energy generators, flux compression generators, and the like supply large amounts of electrical energy and may be used in many commercial and scientific applications. One exemplary application that may utilize a ferroelectric energy generator is a microwave transmitter system. The output of the ferroelectric energy generator may be coupled to an antenna that transmits microwave radiation when it receives electrical energy. Although conventional ferroelectric energy generators may produce a large amplitude pulse of voltage, they may not be able to quickly deliver electric current to the antenna. As a result, the antenna may not receive the rapid electrical energy pulse that it needs to oscillate and transmit microwaves.

SUMMARY OF THE INVENTION

Embodiments of the present invention solve the above-mentioned problems and provide a distinct advance in the art of energy generators. More particularly, embodiments of the invention provide energy generator systems that include a voltage-controlled switch that is able to deliver a rapid change in electrical current over time, dI/dt.

In a first embodiment, the present invention may provide an energy generating system broadly comprising a ferromagnetic generator configured to generate a pulse of voltage between a pair of output terminals, and a voltage-controlled switch that is connected in series with one of the output terminals of the ferromagnetic generator wherein the voltage-controlled switch closes when the generated voltage pulse reaches a breakdown level.

In a second embodiment, the present invention may provide an energy generating system broadly comprising a flux compression generator configured to generate a pulse of voltage between a pair of output terminals, and a voltage-controlled switch that is connected in series with one of the output terminals of the flux compression generator wherein the voltage-controlled switch closes when the generated voltage pulse reaches a breakdown level.

In a third embodiment, the present invention may provide an energy generating system broadly comprising a ferromagnetic generator configured to generate a pulse of voltage between a pair of output terminals, a power conditioning stage coupled to at least one of the output terminals of the ferromagnetic generator and configured to receive the pulse of voltage and to match the impedance of the ferromagnetic generator to the impedance of a load coupled to the energy generating system, and a voltage-controlled switch coupled to the power conditioning stage wherein the voltage-controlled switch closes when the generated voltage pulse reaches a breakdown level.

In a fourth embodiment, the present invention may provide an energy generating system broadly comprising a flux compression generator configured to generate a pulse of voltage between a pair of output terminals, a power conditioning stage coupled to at least one of the output terminals of the flux compression generator and configured to receive the pulse of voltage and to match the impedance of the flux compression generator to the impedance of a load coupled to the energy generating system, and a voltage-controlled switch coupled to the power conditioning stage wherein the voltage-controlled switch closes when the generated voltage pulse reaches a breakdown level.

In a fifth embodiment, the present invention may provide an energy generating system broadly comprising a ferroelectric generator configured to generate a pulse of voltage between a pair of output terminals, a power conditioning stage coupled to at least one of the output terminals of the ferroelectric generator and configured to receive the pulse of voltage and to match the impedance of the ferroelectric generator to the impedance of a load coupled to the energy generating system, and a voltage-controlled switch coupled to the power conditioning stage wherein the voltage-controlled switch closes when the generated voltage pulse reaches a breakdown level.

This summary is provided to introduce a selection of concepts in a simplified form that are further described below in the detailed description. This summary is not intended to identify key features or essential features of the claimed subject matter, nor is it intended to be used to limit the scope of the claimed subject matter.

Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 8:
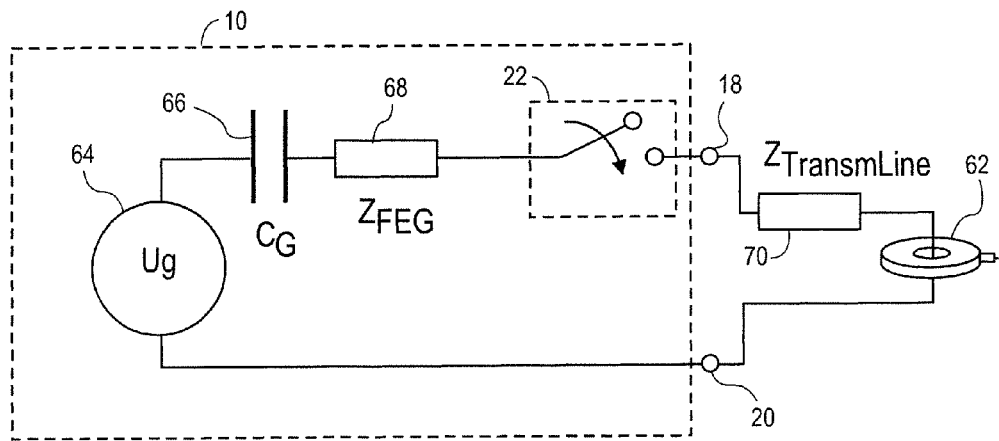
Figure 9:
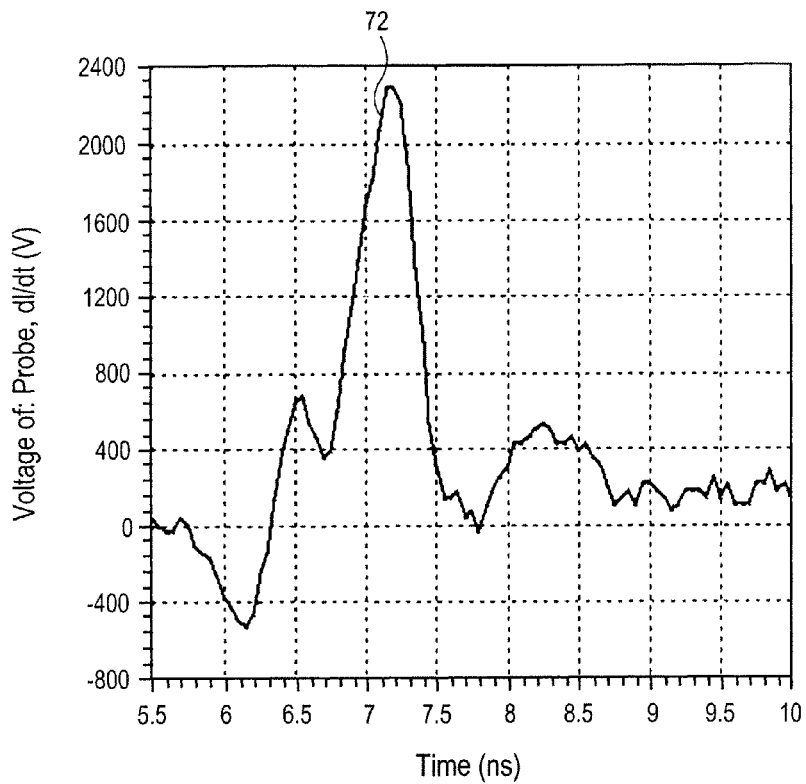
Figure 10:
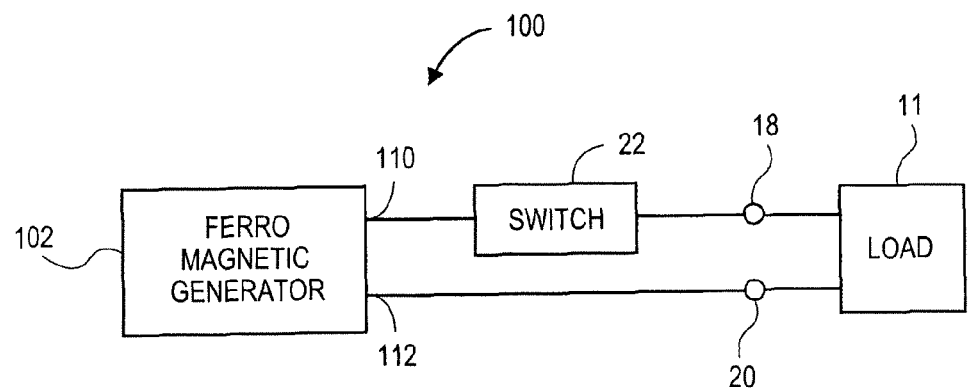
Figure 11:
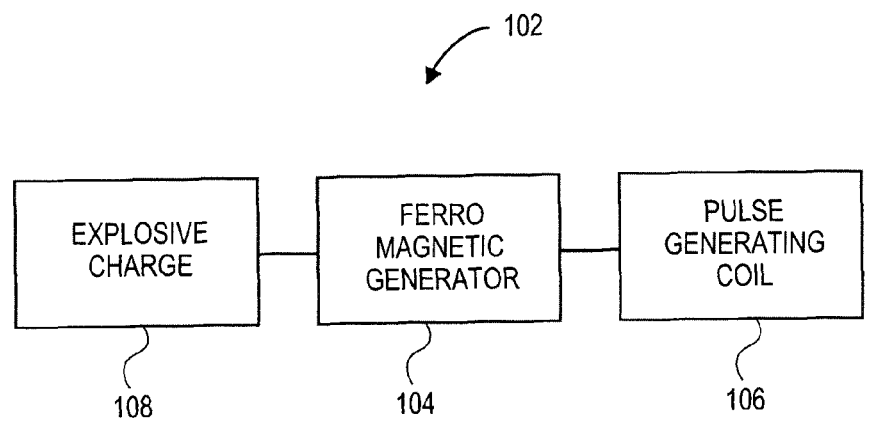
Figure 12:
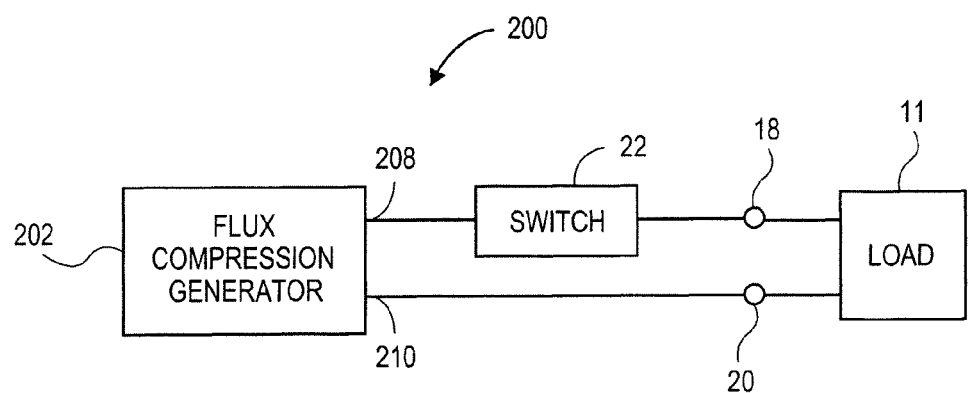
Figure 13:
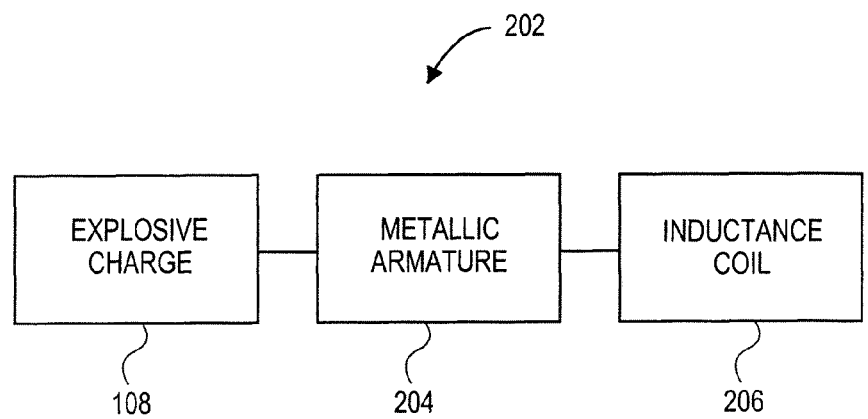
Figure 14:
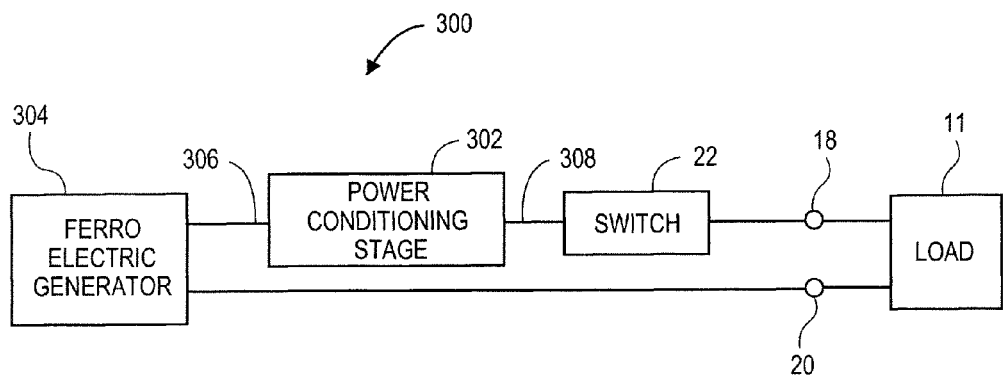
Figure 15:
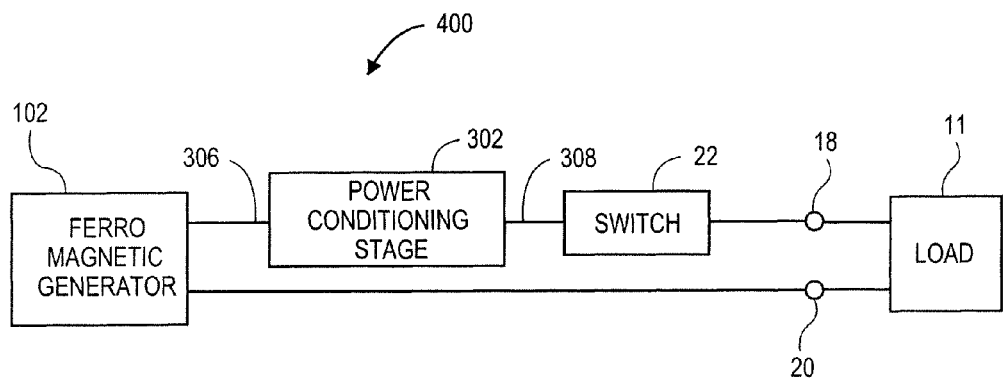
Figure 16:
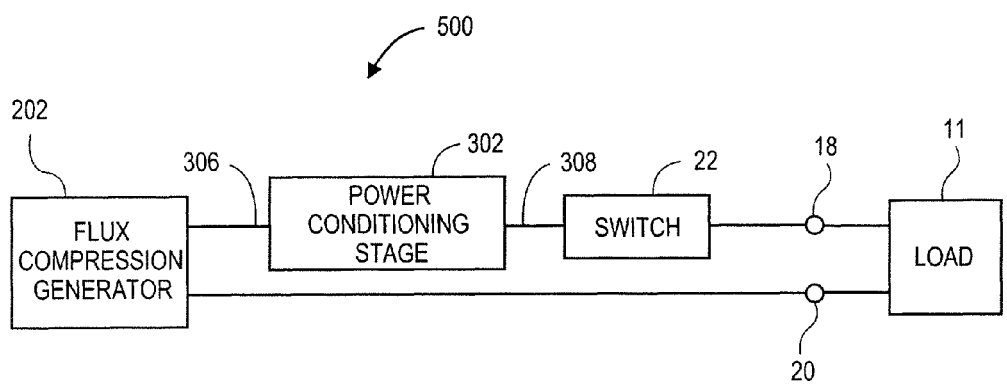
Figure 17:
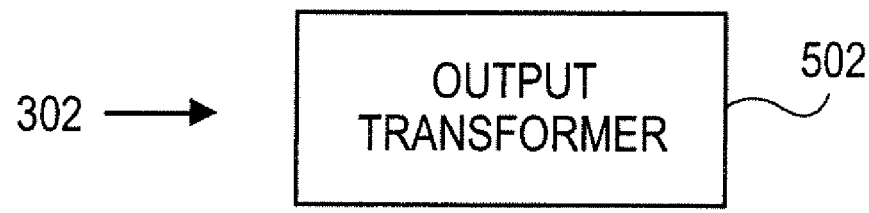
Figure 17:
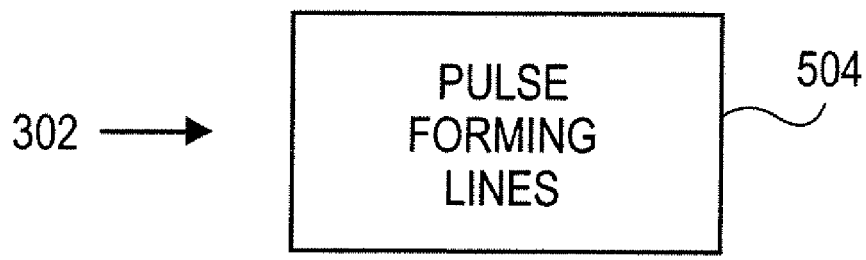
Figure 17:
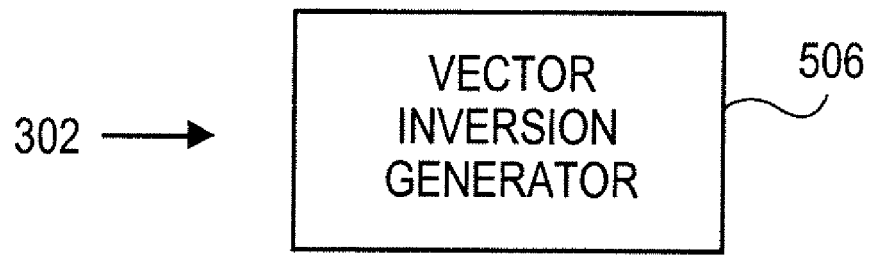
Figure 18:
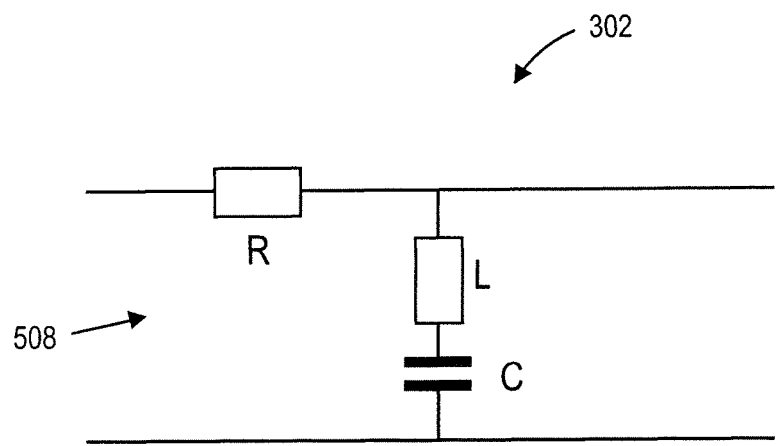
Figure 19:
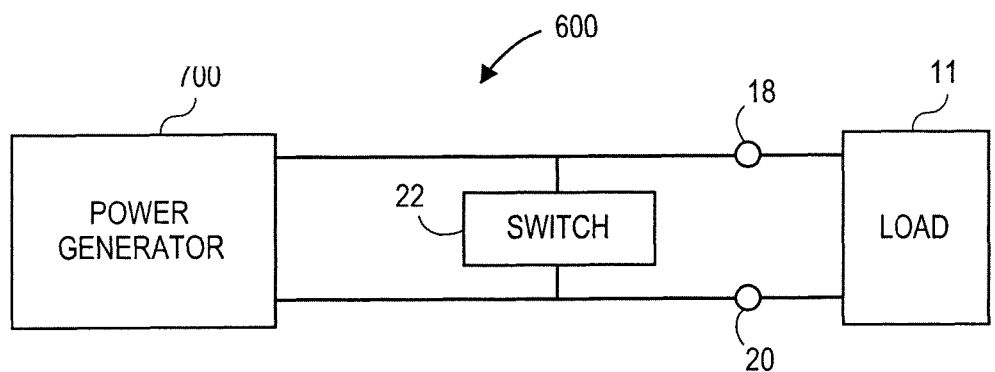
Figure 20:
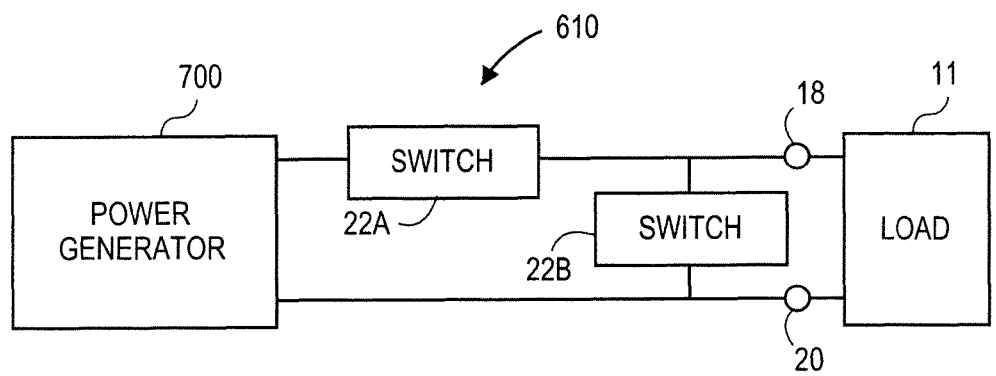
Figure 21:
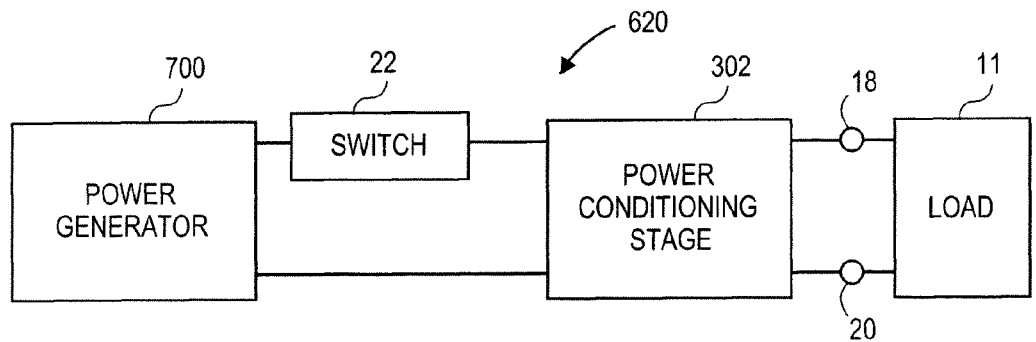
Figure 22:
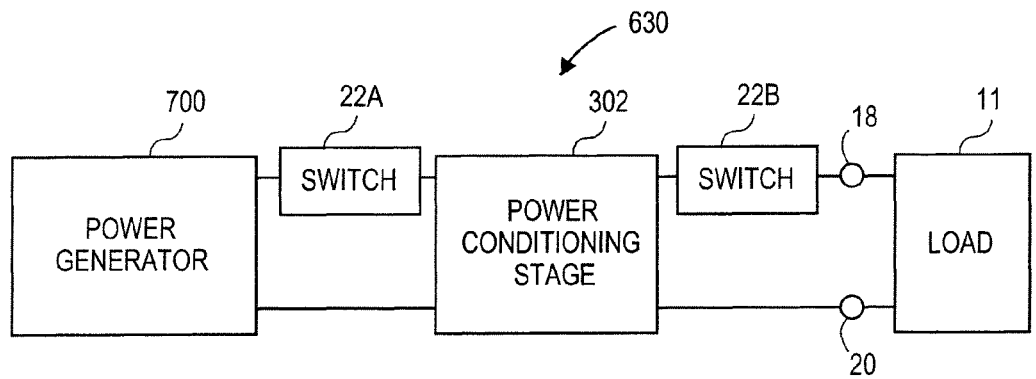
Figure 23:
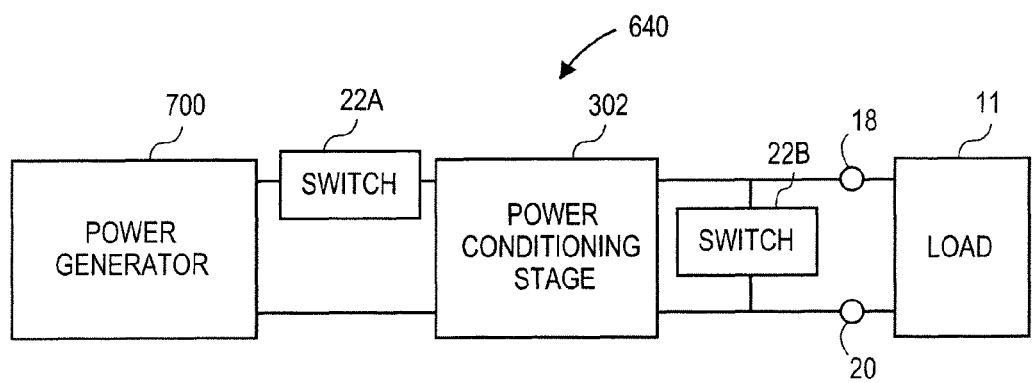
Figure 24:
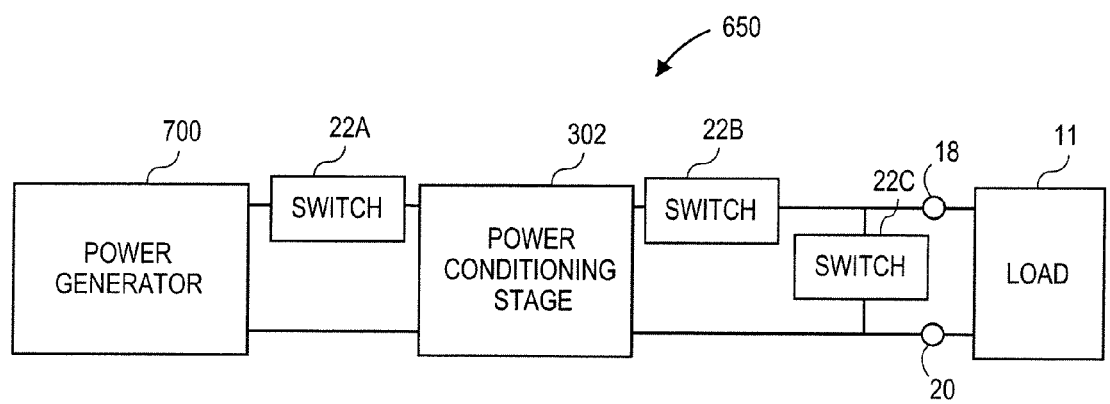

FIG. 8 a schematic diagram of a circuit that is equivalent to the second embodiment of the ferroelectric energy generator system;

FIG. 9 is a plot of the voltage versus time for a second output waveform of the ferroelectric energy generator system;

FIG. 10 is a block diagram of a third embodiment of the energy generating system;

FIG. 11 is a block diagram of a ferromagnetic generator;

FIG. 12 is a block diagram of a fourth embodiment of the energy generating system;

FIG. 13 is a block diagram of a flux compression generator;

FIG. 14 is a block diagram of a fifth embodiment of the energy generating system;

FIG. 15 is a block diagram of a sixth embodiment of the energy generating system;

FIG. 16 is a block diagram of a seventh embodiment of the energy generating system;

FIG. 17 is a block diagram of various embodiments of a power conditioning stage;

FIG. 18 is a schematic diagram of another embodiment of the power conditioning stage;

FIG. 19 is a block diagram of an eighth embodiment of the energy generating system;

FIG. 20 is a block diagram of a ninth embodiment of the energy generating system;

FIG. 21 is a block diagram of a tenth embodiment of the energy generating system;

FIG. 22 is a block diagram of an eleventh embodiment of the energy generating system;

FIG. 23 is a block diagram of a twelfth embodiment of the energy generating system; and FIG. 24 is a block diagram of a thirteenth embodiment of the energy generating system.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

The present application is related to U.S. Patent Application titled "FERROELECTRIC ENERGY GENERATOR, SYSTEM, AND METHOD," Ser. No. 11/461,349, filed Jul. 31, 2006. The identified earlier-filed application is hereby incorporated by reference in its entirety into the present application.

Figure 1:
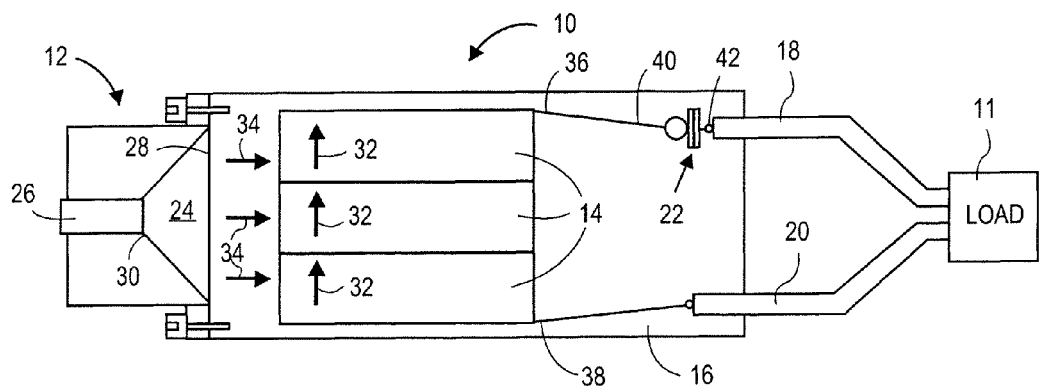
FIG. 1 is a block diagram of a ferroelectric energy generator system constructed in accordance with various embodiments of the present invention.

A ferroelectric energy generator system 10 may be utilized as an energy source with power conditioning abilities to supply energy to other components, systems, or loads 11, as seen in FIG. 1. Power conditioning may involve controlling a property or aspect of the energy that a source is able to deliver. For example, the ferroelectric energy generator system 10 with power conditioning abilities may be able to deliver a pulse of electric voltage or a pulse of electric current.

One application that may utilize the ferroelectric energy generator system 10 is a microwave transmitter. The output of the ferroelectric energy generator system 10 may be coupled to an antenna, that acts as the load 11. The ferroelectric energy system 10 may deliver a burst of electric current that is switched on very quickly. Hence, the change in electrical current over time, dI/dt, may be very large. The rapid delivery of electrical current to the antenna may drive the antenna into oscillation that generates microwave radiation.

The ferroelectric energy generator system 10, constructed in accordance with various embodiments of the present invention and shown in FIGS. 1-3 and 7, broadly comprises an explosive unit 12, a ferroelectric element 14, a generator body 16, a first output terminal 18, a second output terminal 20, and a voltage-controlled switch 22.

The explosive unit 12 generally provides directional explosive shock wave energy to the ferroelectric element 14. Accordingly, the explosive unit 12 may be coupled to the generator body 16 in close proximity to the ferroelectric element 14. The explosive unit 12 may include an explosive charge 24 and a detonator 26.

The explosive charge 24 may be any explosive element operable to initiate a shock wave that propagates at least partially through the ferroelectric element 14. The explosive charge 24 may include high explosive elements to reduce the volume and amount of material required to initiate the desired shock wave discussed below. In various embodiments, the explosive charge 24 may include or is otherwise formed from a cyclotrimethylene trinitramine (RDX) high explosive or other detonable high explosive.

The explosive charge 24 may present a shape having a tapered width, such that the explosive charge 24 may include a narrow end and an opposing widened end, with the widened end being of greater dimension, such as width, than the narrow end. In various embodiments, the explosive charge 24 may present a generally conical configuration having a base 28 and an apex 30. As shown in FIG. 1, the explosive charge 24 may be positioned such that the base 28 is directed towards the ferroelectric element 14 and the apex 30 is directed away from the ferroelectric element 14. The explosive charge 24 is coupled with the detonator 26 in proximity to the apex 30. Such a configuration facilitates generation of the desired transverse shock wave discussed below. Utilization of a malleable explosive also facilitates formation of the various embodiments of the present invention by enabling the explosive charge 24 to be easily formed into the desired conical configuration. However, as should be appreciated, the explosive charge 24 may present any shape and be malleable or non-malleable.

The detonator 26 is generally coupled with the explosive charge 24 to enable detonation of the explosive charge 24 and generation of the desired shock wave. As discussed above, the detonator 26 may be coupled with the apex 30 of the explosive charge 24. However, the detonator 26 may be directly or indirectly coupled in any configuration with the explosive charge 24. In various embodiments, the detonator 26 includes an RD-501 EBW detonator. However, the detonator 26 may include any elements operable to detonate the explosive charge 24 and may be specifically configured for compatibility with the explosive charge 24. The detonator 26 may be coupled with an external control system to control the function and timing of the detonation of the explosive charge 24.

The ferroelectric element 14 may include any ferroelectric or piezoelectric material. "Ferroelectric material" as utilized herein refers to any material that possesses a spontaneous dipole moment. The spontaneous dipole moment provided by ferroelectric materials is in contrast to the permanent magnetic moment provided by ferromagnetic materials. In various embodiments, the ferroelectric element 14 is comprised of lead zirconate titanate, $PbZr_{0.52}Ti_{0.48}O_3$(PZT). Utilization of lead zirconate titanate is desirable in various embodiments as it provides a marked piezoelectric effect. Specifically, when compressed and/or depolarized, lead zirconate titanate will develop a substantial voltage difference across two of its faces, as is discussed below in more detail. However, in some embodiments, the ferroelectric element 14 may comprise barium titanate, $BaTiO_3$, or other ferroelectric or piezoelectric materials. The ferroelectric element 14 may be comprised of hard or soft lead zirconate titanate.

The ferroelectric element 14 may present a generally rectangular configuration to enable the ferroelectric element 14 to present opposed ends and four sides extending therebetween. However, as should be appreciated, the ferroelectric element 14 may be formed in any shape or configuration, including cylindrical and non-uniform configurations.

The polarization of the ferroelectric element 14 is represented by a polarization vector 32. As shown in FIG. 1, the polarization vector 32 is generally transverse to the longitudinal axis of the ferroelectric element 14. As discussed in more detail below, such a configuration facilitates the generation of energy by allowing a shock wave 34 generated by detonation of the explosive charge 24 to propagate generally transverse to the polarization vector 32 instead of generally parallel to the polarization vector 32. However, the ferroelectric element 14 may be polarized in any direction or orientation.

When the ferroelectric energy generator system 10 is operable, in some embodiments, the generated shock wave 34 may not necessarily be transverse to the polarization vector 32 of the ferroelectric element 14. For instance, the generated shock wave 34 may propagate through the ferroelectric element 14 at any angle relative to the polarization vector 32, including non-transverse, parallel, or any other angle, depending on the particular configuration of the ferroelectric element 14 and explosive charge 24.

Consequently, the present invention enables the ferroelectric element 14 to be compressed and depolarized through direct shock wave action, thereby increasing the reliability, effectiveness, and efficiency of the ferroelectric energy generator system 10. As should be appreciated, the ferroelectric element 14 does not need to be completely or totally compressed and depolarized by the shock wave 34. Thus, embodiments of the present invention may generate energy through only partial depolarization and compression of the ferroelectric element 14.

The ferroelectric element 14 may present any size. For example, the size, such as the volume, length, and width of the ferroelectric element 14 may be varied to provide certain or desired voltages. In various embodiments, the ferroelectric element 14 presents a generally elongated rectangular configuration having dimensions of approximately 12.7 mm by 12.7 mm by 51 mm. In some embodiments, the ferroelectric element 14 may be an EC-64 bar of lead zirconate titanate sold by ITT Corporation of New York, N.Y. In other embodiments, the ferroelectric element 14 may be a PZT 95/5 element from TRS Technologies, Inc. of State College, Pa.

The ferroelectric element 14 may include a third output terminal 36 and a fourth output terminal 38 that are coupled to the sides of the ferroelectric element 14, such that shock wave compression and depolarization of the ferroelectric element 14 generates a voltage across the third output terminal 36 and the fourth output terminal 38. Accordingly, the third output terminal 36 and the fourth output terminal 38 may possess a polarity. For example, the third output terminal 36 may generate a relatively positive voltage and the fourth output terminal 38 may generate a relatively negative voltage, or vice-versa.

In various embodiments, a plurality of ferroelectric elements 14 may be utilized in the same ferroelectric energy generator system 10, as shown in FIGS. 1, 2, 5, and 7, wherein three ferroelectric elements 14 are utilized. The additional ferroelectric elements 14 may be included in order to meet greater energy output requirements or other design criteria or specifications. In such embodiments, the ferroelectric elements 14 are typically positioned and oriented such that their polarization vectors 32 are aligned. Furthermore, the ferroelectric elements 14 may be connected in a series fashion, with the positive terminal of one ferroelectric element 14 connected to the negative terminal of the next, such that the voltage output of the plurality of ferroelectric elements 14 is the sum of the voltage outputs of each individual ferroelectric element 14. In alternative embodiments, the plurality of ferroelectric elements 14 may be connected in a parallel fashion, with the positive terminals of all the ferroelectric elements 14 connected together and the negative terminals of all the ferroelectric elements 14 connected together, such that the current output of the plurality of ferroelectric elements 14 is the sum of the current output of each of the ferroelectric elements 14.

The body 16 of the ferroelectric energy generator system 10 generally provides a medium in which to connect the ferroelectric element 14 with the voltage-controlled switch 22, the first output terminal 18, and the second output terminal 20. The body 16 further holds the ferroelectric element 14 in proximity to the explosive unit 12. In various embodiments, the ferroelectric energy generator system 10 may further include a housing (not shown) to surround the body 16 and the explosive unit 12 to protect the ferroelectric energy generator system 10 during transport and handling.

Figure 2:
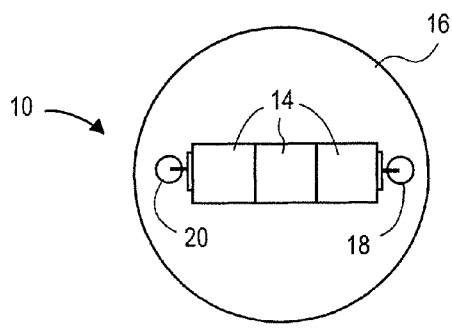
FIG. 2 is a top view of the energy generator of FIG. 1.
Figure 3:
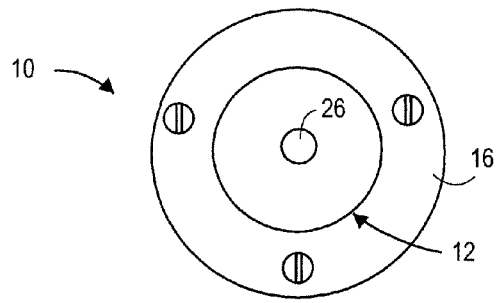
FIG. 3 is a bottom view of the energy generator of FIGS. 1-2.

The body 16 may present any shape or configuration. In some embodiments, the body 16 may present a generally cylindrical or tubular configuration as shown in FIGS. 1-3. In some embodiments employing a cylindrical configuration, the body 16 has a length of approximately 100 mm and an outer diameter of approximately 55 mm. Thus, the present invention may be compactly employed to provide large amounts of electrical energy. However, the body 16 may be any size in order to include any number of ferroelectric elements 14.

The body 16 may be at least partially filled with a dielectric filling to facilitate positioning and shock matching of the ferroelectric element 14. For instance, the dielectric filling may include epoxy or any other hardening substance to solidify the position of the ferroelectric element 14 and the explosive charge 24.

Figure 4:
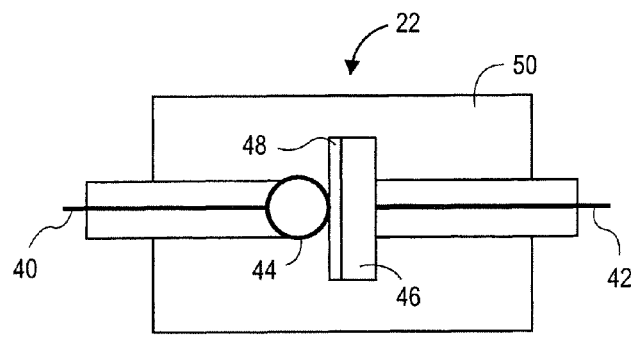
FIG. 4 is a block diagram of a voltage-controlled switch.

The voltage-controlled switch 22 generally enables the ferroelectric energy generator system 10 to deliver energy from the ferroelectric element 14 to the load 11 or another component or system much more quickly than the system 10 would without the switch 22. Thus, the ferroelectric element 14 acts as a source of voltage for the voltage-controlled switch 22. As shown in FIG. 4, the voltage-controlled switch 22 may include a fifth output terminal 40, a sixth output terminal 42, a first electrode 44, a second electrode 46, a dielectric film 48, and a switch body 50. As explained in more detail below, the voltage-controlled switch 22 is normally open but closes when the voltage across the fifth output terminal 40 and the sixth output terminal 42 reaches or exceeds a breakdown level.

The fifth output terminal 40 and the sixth output terminal 42 generally couple the voltage-controlled switch 22 to other components. The fifth output terminal 40 may be coupled to the third output terminal 36 (of the ferroelectric element 14), while the sixth output terminal 42 may be coupled to the first output terminal 18 (of the ferroelectric energy generator system 10). The fifth output terminal 40 and the sixth output terminal 42 may typically be manufactured from electrically-conductive material.

The first electrode 44 and the second electrode 46 generally hold electrical charge such that there is a potential difference, or voltage, between the first electrode 44 and the second electrode 46. Accordingly, the first electrode 44 and the second electrode 46 may typically be manufactured from electrically-conductive material. In various embodiments, the first electrode 44 may be spherical shaped and the second electrode 46 may be of square or rectangular plate shape. In general, the first electrode 44 and the second electrode 46 may assume any shape or dimension. However, one of either the first electrode 44 or the second electrode 46 may have a curved, spherical, or otherwise rounded shape to counter physical edge-effect phenomena that a flatter electrode 44 may possess. These phenomena may lead to a reduced and/or inconsistent switching voltage or to premature closing of the voltage-controlled switch 22. The shape and dimension of the first electrode 44 and the second electrode 46 may depend on the switching voltage or other parameter of the specific application of the voltage-controlled switch 22.

The dielectric film 48 generally controls the function of the voltage-controlled switch 22. When the voltage between the first electrode 44 and the second electrode 46 remains below the breakdown level, the dielectric film 48 is insulating, and the voltage-controlled switch 22 remains open. When the voltage between the first electrode 44 and the second electrode 46 reaches the breakdown level, the dielectric film 48 loses its insulating properties and becomes conductive, thereby closing the voltage-controlled switch 22. Since the ferroelectric element 14 supplies the voltage to the voltage-controlled switch 22, the ferroelectric element 14 must be able to supply at least the breakdown voltage level, and preferably even more than the breakdown level.

In some embodiments, the dielectric film 48 may include a plurality of individual films positioned adjacent to one another. The dielectric film 48 is generally positioned between the first electrode 44 and the second electrode 46, and in contact with both, although in some embodiments, there may be a layer of epoxy or similar insulating compound between the dielectric film 48 and the first electrode 44 and the second electrode 46. In various embodiments, the dielectric film 48 may be of similar shape to the second electrode 46, as seen in FIG. 4. Although, in general, the dielectric film 48 may be shaped similar to either the first electrode 44 or the second electrode 46 or both.

The dielectric film 48 may be created using any dielectric material. In various embodiments, the dielectric film 48 may be created using solid dielectric materials including a polymer or polyimide such as Kapton, mylar, parylene, Teflon, or a similar material. The dielectric film 48 may also include solid dielectric compounds such as epoxy or polyurethane. In addition, the dielectric film 48 may include combinations of the polymers with the compounds.

The dielectric strength of the material and the thickness of the dielectric film 48 may determine the voltage at which the dielectric film 48 breaks down and becomes conductive. Generally, a thicker film 48 and a higher dielectric strength will lead to a higher breakdown voltage. The thickness of the dielectric film 48 may also determine the closing time of the switch 22, or the time it takes for the dielectric film 48 to change from mostly insulating to mostly conductive. Generally, a thinner film 48 will lead to a shorter closing time or a faster voltage-controlled switch 22. Furthermore, the thickness of the film 48 may determine the electrical resistance and inductance of the conductive channel once the film 48 breaks down. Generally, a thinner film 48 will lead to smaller resistance and inductance. These properties may determine the performance of the voltage-controlled switch 22.

As may be appreciated, the thickness of the dielectric film 48 and the dielectric strength, as determined by the material used, may be chosen to achieve a desired breakdown voltage, closing time, or other performance parameter. Exemplary embodiments of the voltage-controlled switch 22 have preferable closing times from about 100 picoseconds (ps) to about 50 nanoseconds (ns), more preferable closing times from about 100 ps to about 5 ns, and most preferable closing times from about 100 ps to about 500 ps, depending on the properties of the film 48 employed, such as thickness of the film 48 and dielectric strength. It is believed that some embodiments of the switch 22 have a closing time in the range of 10 ps. Embodiments of the dielectric film 48 made of Kapton have a thickness of approximately 75 microns and a breakdown voltage of approximately 35 kiloVolts (kV), a thickness of approximately 125 microns and a breakdown voltage of approximately 75 kV, and a thickness of approximately 150 microns and a breakdown voltage of approximately 100 kV.

The thickness of the dielectric film 48 and its dielectric strength were chosen to produce the ranges of closing time and breakdown voltage discussed above in order to work with a particular application. For other applications, the voltage-controlled switch 22 may have a higher or a lower breakdown voltage than discussed above. The voltage-controlled switch 22 may also have a closing time that is longer than discussed above—perhaps even on the order of microseconds.

The switch body 50 generally provides a medium in which to properly house the fifth output terminal 40, the sixth output terminal 42, the first electrode 44, the second electrode 46, and the dielectric film 48. The switch body 50 further electrically insulates and provides structural strength for the components during handling and installation of the voltage-controlled switch 22. The switch body 50 may be manufactured from a dielectric material such as polyurethane.

The voltage-controlled switch 22 may present any shape or size. For example, the voltage-controlled switch 22 may be spherical, tubular or cylindrical, cubic or rectangular-box shaped. The volume of the voltage-controlled switch 22 may range from about 1 centimeter$^3$ (cm$^3$) down to about 0.25 cm$^3$ or smaller.

In various embodiments, the ferroelectric energy generator system 10 may include a plurality of voltage-controlled switches 22 in order to control the performance characteristics of the system 10. For example, the amplitude, the rise time, or other waveform characteristics of either the voltage or the current output of the ferroelectric energy generator system 10 may be modified by increasing the number of voltage-controlled switches in the system 10. The additional voltage-controlled switches may be connected in series, in parallel, or configurations that are a series-parallel combination.

The first output terminal 18 and the second output terminal 20 generally provide electrical output of the ferroelectric energy generator system 10 in order to electrically couple the ferroelectric energy generator system 10 to another component or system. Thus, the first output terminal 18 and the second output terminal 20 are typically constructed of metallic material, such as wiring or cabling. As is known in the art, the first output terminal 18 and the second output terminal 20 may be coated or covered with insulating material with the end of each terminal exposed. The first output terminal 18 and the second output terminal 20 may be positioned in proximity to one another to protrude from one end of the body 16—typically the end of the body 16 opposing the explosive unit 12. The first output terminal 18 may be coupled to the sixth output terminal 42 (from the voltage-controlled switch 22). The second output terminal 20 may be coupled to the fourth output terminal 38 (from the ferroelectric element 14). Furthermore, the first output terminal 18 and the second output terminal 20 may possess a polarity. In various embodiments, the first output terminal 18 may have a relatively positive voltage while the ferroelectric energy generator system 10 is active, and the second output terminal 20 may have a relatively negative voltage while the ferroelectric energy generator system 10 is active. In other embodiments, the polarity of the first output terminal 18 and the second output terminal 20 may be reversed.

The ferroelectric energy generator system 10 may operate as follows. The detonator 26 of the explosive unit 12 may be energized from an external source. Consequently, the explosive charge 24 may be detonated resulting in an explosive shock wave 34 propagating toward the ferroelectric element 14. The shock wave 34 may compress the ferroelectric element 14 generally transverse to its polarization vector 32. Upon compression, the ferroelectric element 14 may generate a high amplitude pulse of voltage across the third output terminal 36 and the fourth output terminal 38.

The generation of voltage from the ferroelectric element 14 may lead to an accumulation of charge on the first electrode 44 of the voltage-controlled switch 22, thus creating a voltage across the terminals of the switch 22 (the fifth output terminal 40 and the sixth output terminal 42). Initially, the dielectric film 48 may be insulating and the voltage-controlled switch 22 may be open. As charge builds on the first electrode 44, the voltage across the terminals of the switch 22 and in turn, across the dielectric film 48, increases to the level of the breakdown voltage of the dielectric film 48. Once this happens, at least a portion of the dielectric film 48 becomes conductive and an electric path is established from the first electrode 44 to the second electrode 46, the sixth output terminal 42, the first output terminal 18, and ultimately the load 11 of the ferroelectric energy generator system 10. The buildup of charge in the voltage-controlled switch 22 forces a pulse of electrical current to flow along the electrical path in a short amount of time. Thus, the ferroelectric energy generator system 10 may deliver a large change in current, dI/dt, to the load 11. Rise times, which may be the time during which the current increases from 10% of its peak value to 90% of its peak value, of the change in current dI/dt may range from 100 ps to 10 ns.

Various embodiments of the ferroelectric energy generator system 10 were tested to compare the performance of a first embodiment 52 of the system 10 without the voltage-controlled switch 22 to a second embodiment 54 of the system 10 that includes the voltage-controlled switch 22.

Figure 5:
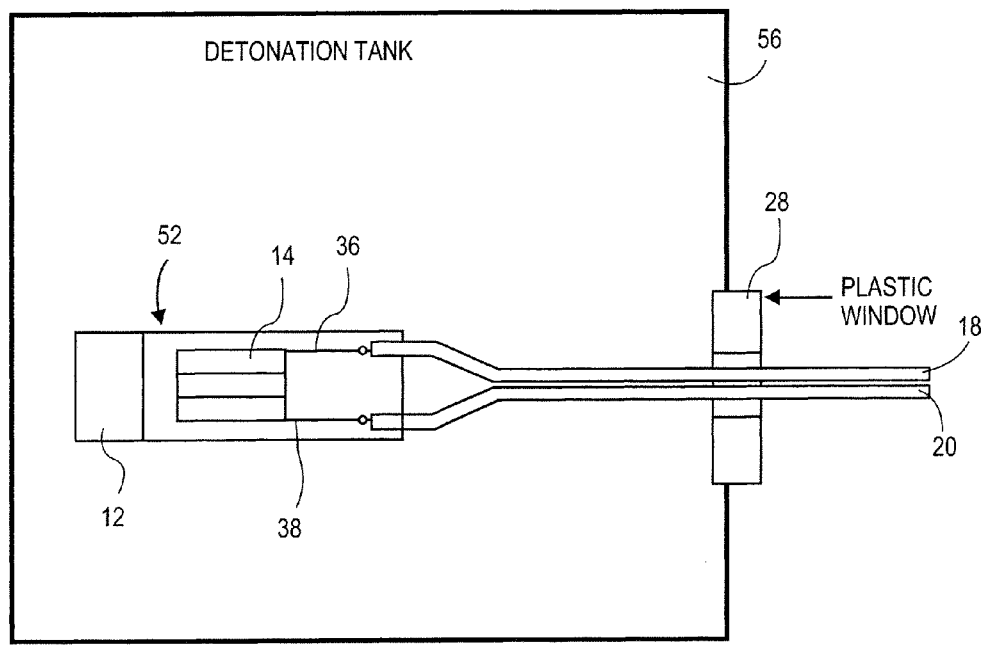
FIG. 5 is a block schematic diagram of a first embodiment of the ferroelectric energy generator system positioned in a detonation tank.
Figure 6:
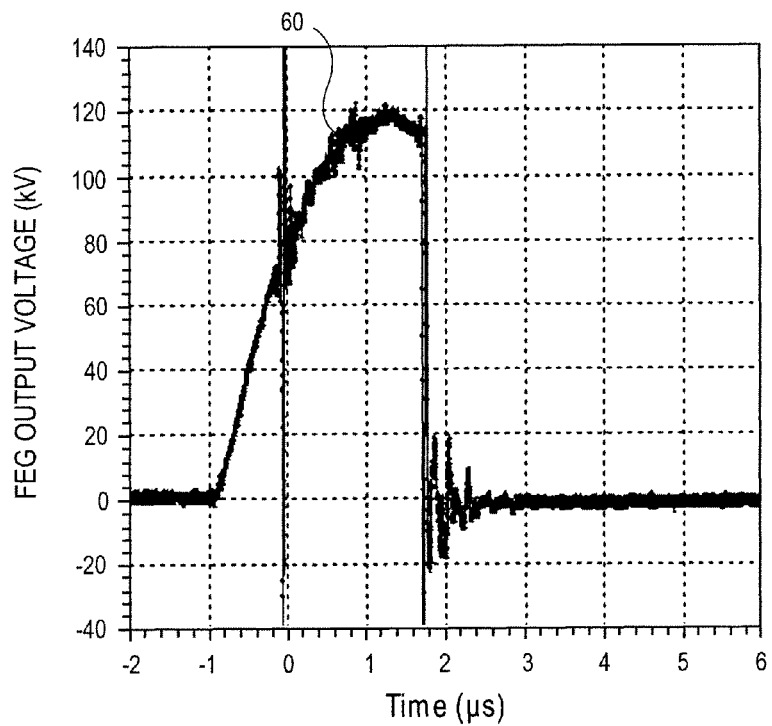
FIG. 6 is a plot of the voltage versus time for a first output waveform of the ferroelectric energy generator system.

The first embodiment 52 of the ferroelectric energy generator system 10 excluded the voltage-controlled switch 22, as shown in FIG. 5. Thus, the third output terminal 36 was coupled directly to the first output terminal 18. There were three EC-64 ferroelectric elements 14 connected in series. The first embodiment 52 was placed in a detonation tank 56 with the first output terminal 18 and the second output terminal 20 extended through a plastic window 58, as seen in FIG. 5. An oscilloscope probe was connected to the first output terminal 18 and the second output terminal 20 to measure the open circuit voltage output of the first embodiment 52 of the ferroelectric energy generator system 10. The explosive unit 12 was detonated and the output voltage was recorded and displayed as a first waveform 60 in FIG. 6. As can be seen, the first waveform 60 has a peak voltage of approximately 121 kV and a rise time of approximately 2.2 microseconds ($\mu s$).

Figure 7:
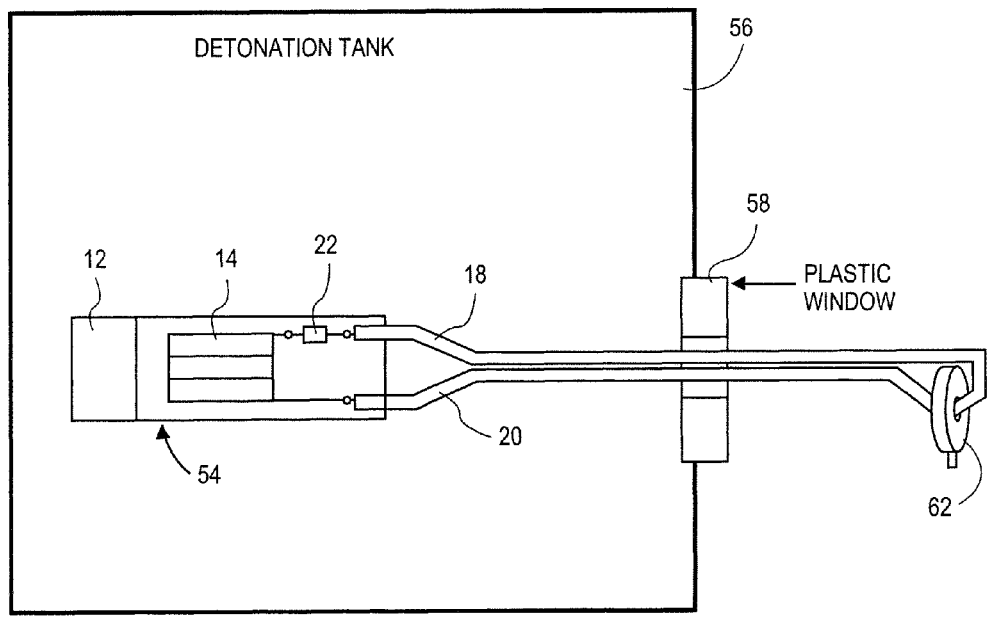
FIG. 7 is a block schematic diagram of a second embodiment of the ferroelectric energy generator system positioned in a detonation tank.

The second embodiment 54 of the ferroelectric energy generator system 10 was substantially similar to the system 10 of FIG. 1 and was placed in the detonation tank 56 with the first output terminal 18 and the second output terminal 20 extended through the plastic window 58, as shown in FIG. 7. There were three EC-64 ferroelectric elements 14 connected in series, and the voltage-controlled switch 22 had a breakdown voltage of approximately 35 kV. To measure the current output of the second embodiment 54, the first output terminal 18 and the second output terminal 20 were shorted together. An induced current probe 62, operable to measure the change in current over time, dI/dt, was inserted in the loop of the first output terminal 18 and the second output terminal 20. In various embodiments, the induced current probe 62 was a Prodyne I-265 probe, manufactured by Prodyne, Inc. of Albuquerque, N. Mex. The induced current probe 62 measured dI/dt, from which the voltage could be derived through the relationship: dI/dt×M, where M is the mutual inductance of the induced current probe 62.

An equivalent circuit to the second embodiment 54 of the ferroelectric energy generator system 10 is shown in FIG. 8 with the ferroelectric element 14 modeled as a voltage source 64 in series with a capacitance 66 and an impedance 68. The voltage-controlled switch 22 is coupled thereto. The first output terminal 18 and the second output terminal 20 shorted together are modeled as a transmission line impedance 70, with the induced current probe 62 in series.

The explosive unit 12 of the second embodiment 54 was detonated and dI/dt was measured and recorded by the induced current probe 62. The results are shown in a second waveform 72 of FIG. 9. As can be seen, the rise time of the second waveform 72 is on the order of 700 ps. Compared with the voltage rise time of approximately 2.2 $\mu s$ for the system 10 without the voltage-controlled switch 22, the system with the voltage-controlled switch 22 is able to deliver a change in electric current by several orders of magnitude. A system 10 such as the second embodiment 54 may be utilized with a microwave transmitter to deliver a burst of electric current that may drive the antenna into oscillation in order to generate microwave radiation.

A third embodiment of the energy generating system 100 is shown in FIG. 10, and broadly comprises a ferromagnetic generator 102 and the voltage-controlled switch 22. The system 100 may further include the first and second output terminals 18, 20 across which the load 11 may be connected, similar to FIG. 1.

The ferromagnetic generator 102 generally supplies a pulse of electric energy resulting from an explosively driven shock wave. An exemplary ferromagnetic generator 102, as shown in FIG. 11, may include a ferromagnetic element 104, a pulse generating coil 106, and an explosive charge 108.

The ferromagnetic generator 102 may additionally include a first output terminal 110 and a second output terminal 112. The first output terminal 110 of the ferromagnetic generator 102 may couple to the first output terminal 40 of the switch 22. The second output terminal 42 of the switch 22 may couple to the first output terminal 18 of the system 100. The second output terminal 112 of the ferromagnetic generator 102 may couple to the second output terminal 20 of the system 100.

The ferromagnetic element 104 may be constructed from a hard ferromagnetic material such as $Nd_xFe_yB$ (Neodymium, Iron, and Boron). In various embodiments, the ferromagnetic element 104 may be a permanent magnet. The pulse generating coil 106 may be an electrically conductive coil that is wrapped around the ferromagnetic element 104. The explosive charge 108 may be substantially similar to the explosive element 24 described above and may be positioned in contact with the ferromagnetic element 104.

A brief summary of the operation of the ferromagnetic generator 102 follows. Initially, the ferromagnetic element 108 generates a magnetic field with a certain amount of flux. Detonation of the explosive charge 108 quickly demagnetizes the ferromagnetic element 104. Accordingly, the magnetic field collapses and the flux rapidly changes from a fixed, certain value to near zero. As a result, and corresponding to Faraday's law, a high amplitude pulse of electrical energy may be generated or induced in the pulse generating coil 106, which is delivered to the voltage-controlled switch 22. In a similar fashion to the ferroelectric system 10 described above, the switch 22 may close quickly and deliver a high amplitude, very short pulse of electric current to a load 11 connected to the system output terminals 18, 20. Exemplary embodiments of the ferromagnetic generator 102 may be described in the paper, "Longitudinal-shock-wave compression of $Nd_2Fe_{14}B$ high-energy hard ferromagnet: The pressure-induced magnetic phase transition", published in Applied Physics Letters, Feb. 24, 2003, Volume 82, Number 8, pages 1248-1250, and "Transverse Shock Wave Demagnetization of Nd2Fe14B High-Energy Hard Ferromagnetics", Journal of Applied Physics, June, 2002, Volume 92, pages 159-162, both of which are hereby incorporated by reference in their entirety.

A fourth embodiment of the energy generating system 200 is shown in FIG. 12, and broadly comprises a flux compression generator 202 and the voltage-controlled switch 22. The system 200 may further include the first and second output terminals 18, 20 across which the load 11 may be connected, similar to FIG. 1.

The flux compression generator 202 may additionally include a first output terminal 208 and a second output terminal 210. The first output terminal 208 of the flux compression generator 202 may couple to the first output terminal 40 of the switch 22. The second output terminal 42 of the switch 22 may couple to the first output terminal 18 of the system 200. The second output terminal 210 of the flux compression generator 202 may couple to the second output terminal 20 of the system 200.

The flux compression generator 202 generally supplies a pulse of electric energy resulting from an explosively driven shock wave. An exemplary flux compression generator 202, as shown in FIG. 13, may include a metallic armature 204, the explosive charge 108, an inductance coil 206, and an external electric power source (not shown).

The metallic armature 204 may be tubular in shape and loaded with the explosive charge 108. The inductance coil 206 may be an electrically conductive coil that surrounds the metallic armature 204. The inductance coil 206 receive an electric current from the external electric power source which creates a magnetic field in the armature 204.

A brief summary of the operation of the flux compression generator 202 follows. Initially, the inductance coil 206, with externally supplied electric current, establishes a magnetic field in the metallic armature 204. The explosive charge 108 is detonated, thereby causing a rapid change in the magnetic field of the armature 204, which in turn induces a large change of current in the inductance coil 206. The large pulse of electrical energy is delivered to the voltage-controlled switch 22. As discussed above, the switch 22 may close quickly and deliver a high amplitude, very short pulse of electric current to a load 11 connected to the system output terminals 18, 20. An exemplary embodiment of the flux compression generator 202 may be described in the paper, "Electric discharge caused by expanding armatures in flux compression generators", published in Applied Physics Letters, Apr. 30, 2009, Volume 94, Number 171502, which is hereby incorporated by reference in its entirety.

A fifth embodiment of the energy generating system 300 is shown in FIG. 14 and may incorporate a power conditioning stage 302 into the ferroelectric energy generator system 10. Thus, the system 300 may comprise a ferroelectric generator 304, the voltage-controlled switch 22, and the power conditioning stage 302. The ferroelectric generator 304 may include the ferroelectric element 14 coupled to the explosive charge 24, as described above.

The power conditioning stage 302 may include a first terminal 306 and a second terminal 308 and may be positioned in the system 300 such that the first terminal 306 of the power conditioning stage 302 is coupled to the third output terminal 36 of the ferroelectric generator 304 and the second terminal 308 of the power conditioning stage 302 is coupled to the first terminal 40 of the switch 22. Alternate structures of the system 300 are possible as well. For example, the power conditioning stage 302 may be coupled in parallel with the ferroelectric generator 304.

A sixth embodiment of the energy generating system 400 is shown in FIG. 15 and may comprise the ferromagnetic generator 102, the voltage-controlled switch 22, and the power conditioning stage 302. The architecture of the system 400 may be substantially similar to that of the system 300. The first terminal 306 of the power conditioning stage 302 may be coupled to the first output terminal 110 of the ferromagnetic generator 102 and the second terminal 308 of the power conditioning stage 302 is coupled to the first terminal 40 of the switch 22. The system 400 may have alternate structures, such as the power conditioning stage 302 being coupled in parallel with the ferromagnetic generator 102.

A seventh embodiment of the energy generating system 500 is shown in FIG. 16 and may comprise the flux compression generator 202, the voltage-controlled switch 22, and the power conditioning stage 302. The architecture of the system 500 may be substantially similar to those of the system 300 and the system 400. The first terminal 306 of the power conditioning stage 302 may be coupled to the first output terminal 208 of the flux compression generator 202 and the second terminal 308 of the power conditioning stage 302 is coupled to the first terminal 40 of the switch 22. The system 500 may have alternate structures, such as the power conditioning stage 302 being coupled in parallel with the flux compression generator 202.

The systems 300, 400, 500 may also drive the load 11 coupled to the terminals 18, 20. The addition of the power conditioning stage 302 to the systems 300, 400, 500 helps to couple an electric energy source such as the ferroelectric generator 304, the ferromagnetic generator 102, and the flux compression generator 202 to the load 11. The power conditioning stage 302 may match the impedance of the electric energy source to the impedance of the load 11 in order to transfer maximum power from the source to the load 11. As seen in FIG. 17, the power conditioning stage 302 may include components such as an output transformer 502, pulse forming lines 504, or a vector inversion generator 506, either separately or in combination. Additionally, the power conditioning stage 302 may include an LCR circuit 508, as shown in FIG. 18.

The output transformer 502 may be similar to known electric transformers and may include a primary winding and a secondary winding. The primary winding may be coupled to the electric energy source (the ferroelectric generator 304, the ferromagnetic generator 102, or the flux compression generator 202), and the secondary winding may be connected to the load 11 through the voltage-controlled switch 22. The impedance of both the primary winding and the secondary winding may be varied with respect to one another from a relatively high value to a relatively low value in order to match the impedance of the electric energy source to that of the load 11. For example, the output transformer 502 with a low impedance primary winding and a high impedance secondary winding may be used to match the low impedance of the flux compression generator 202 to a high impedance load 11.

The pulse forming lines 504 may include a portion of a plurality or system of coaxial cable lines and may serve as a low inductance capacitive load which provides compression of the electric energy pulse, wherein the electric energy source charges the pulse forming lines 504 while supplying energy to the voltage-controlled switch 22 and ultimately to the load 11. When utilized with the flux compression generator 202, the pulse forming lines 504 may be used in combination with the output transformer 502, such that the pulse forming lines 504 is coupled in series with the switch 22.

The vector inversion generator 506 may be similar to a spiral transformer that acts as a capacitive load to the electric energy source. The vector inversion generator 506 may often be integrated with the voltage-controlled switch 22 such that the vector inversion generator 506 receives a voltage charge from the electric energy source (the ferroelectric generator 304, the ferromagnetic generator 102, or the flux compression generator 202). When the voltage level is high enough, the switch 22 closes, transferring the electric energy pulse to the load 11. The vector inversion generator 506 in combination with the switch 22 generally increases the amplitude of the pulse of the electric energy source by a factor of up to twenty and decreases the rise time from tens of microseconds to single digit nanoseconds. When utilized with the flux compression generator 202, the vector inversion generator 506 may be used in combination with the output transformer 502.

The LCR circuit 508 may include a resistor R, an inductor L, and a capacitor C. The resistor R and the inductor L may be discrete components as are commonly known. However, most often, the resistor R and the inductor L are the characteristic resistance and inductance of the wires or cables that connect the capacitor C to the other components in the systems 300, 400, 500. The capacitance of capacitor C may range from 7 picofarads (pF) to 20 pF. The LCR circuit 508 generally increases the period of a pulse generated by the load 11, when the load 11 includes an antenna. The LCR circuit 508 may also be utilized to vary the frequency of the generated pulse.

Additional system embodiments 600, 610, 620, 630, 640, 650 are shown in FIGS. 19-24. These systems include variations of the systems 10, 100, 200, 300, 400, 500 discussed above.

System 600, as shown in FIG. 19, includes a power generator 700, the switch 22, and the load 11. The power generator 700 may include any of the generators discussed above—the ferromagnetic generator 102, the flux compression generator 202, and the ferroelectric generator 304. The power generator 700, as embodied herein, produces electrical energy as the result of a single explosive-driven event. As discussed above, the power generator 700 may include an explosive charge 24 to supply a one-time explosion. From the explosion, the power generator 700 may produce a pulse of electrical energy, either high-voltage or high-current, after which the power generator 700 may be nonfunctional. Thus, the power generator 700 does not produce electrical energy in a periodic, continuous, or steady state.

The system 600 is similar to the systems 10, 100, 200, except that the switch 22 may be connected in parallel with the power generator 700 and the load 11. The ferroelectric generator 304 is often used as the power generator 700 with the configuration of system 600. A microwave antenna is often used as the load 11. The antenna may act like a low-capacitance capacitor, such that the antenna may develop a small charge as the voltage from the power generator 700 increases. Once the voltage from the power generator 700 reaches the breakdown voltage of the switch 22, the switch 22 closes and current flows through the switch 22, exciting the antenna and thereby radiating a limited number of pulses, ranging from about 25 to about 50, in a burst of microwave power.

System 610, as shown in FIG. 20, includes the power generator 700, a first switch 22A, a second switch 22B, and the load 11. The first switch 22A may be connected in series between the power generator 700 and the load 11. The second switch 22B may be connected in parallel with the load 11. As discussed above, the power generator 700 may deliver an increasing voltage. The first switch 22A and the second switch 22B may close according to a first breakdown voltage and a second breakdown voltage, respectively, as determined by properties of each switch 22A, 22B such as the thickness of the dielectric film 48 and the dielectric strength of the film 48. With this configuration, the power generator 700 may deliver two pulses of energy to the load 11. When a microwave antenna is used as the load 11, the closing of the first switch 22A and the second switch 22B may produce two bursts of microwave radiation.

System 620, as shown in FIG. 21, includes the power generator 700, the switch 22, the power conditioning stage 302, and the load 11. The system 620 is similar to the systems 300, 400, 500, except that the switch 22 may be connected in series between the power generator 700 and the power conditioning stage 302. This architecture quickens the burst of energy delivered to the power conditioning stage 302. Voltage from the power generator 700 may increase until the switch 22 closes, which provides the power conditioning stage 302 with a voltage pulse on the order of nanoseconds as opposed to microseconds.

System 630, as shown in FIG. 22, includes the power generator 700, the first switch 22A, the power conditioning stage 302, the second switch 22B, and the load 11. The first switch 22A may be connected in series between the power generator 700 and the power conditioning stage 302. The second switch 22B may be connected in series between the power conditioning stage 302 and the load 11. This circuit architecture may provide a quick pulse of voltage to the power conditioning stage 302 and the load 11.

System 640, as shown in FIG. 23, includes the power generator 700, the first switch 22A, the power conditioning stage 302, the second switch 22B, and the load 11. The first switch 22A may be connected in series between the power generator 700 and the power conditioning stage 302. The second switch 22B may be connected in parallel between the power conditioning stage 302 and the load 11. This circuit may provide a quick pulse of voltage to the power conditioning stage 302 and current flow through the second switch 22B, which may provide excitation to the load 11.

System 650, as shown in FIG. 24, includes the power generator 700, the first switch 22A, the power conditioning stage 302, the second switch 22B, a third switch 22C, and the load 11. The first switch 22A may be connected in series between the power generator 700 and the power conditioning stage 302. The second switch 22B may be connected in series between the power conditioning stage 302 and the load 11. The third switch 22C may be connected in parallel with the load 11. This circuit may provide a quick pulse of voltage to the power conditioning stage 302 and two pulses of energy to the load 11.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

The invention claimed is:

1. An energy generating system comprising:
a pair of output terminals to which a load is connected;
a power generator configured to generate a pulse of electrical energy; and
a voltage-controlled switch coupled to the power generator, wherein the voltage-controlled switch closes when the generated electrical energy pulse reaches a breakdown level and the switch transfers electrical energy to the output terminals, the voltage-controlled switch including:
a first output terminal and a second output terminal configured to couple the voltage-controlled switch to at least one component,
a first electrode and a second electrode coupled to the first output terminal and the second output terminal, respectively, and configured to possess a voltage therebetween, and
a dielectric film positioned between the first electrode and the second electrode and configured to become electrically conductive when the voltage between the first electrode and the second electrode reaches the breakdown level,
wherein one of the first electrode or the second electrode has an arcuate shape facing the dielectric film.

2. The energy generating system of claim 1, wherein the power generator includes a ferromagnetic generator comprising:
a pulse generating coil,
an explosive charge, and
a ferromagnetic element configured to generate a magnetic field, the ferromagnetic element positioned within the pulse generating coil and in proximity to the explosive charge, such that detonation of the explosive charge decreases the magnetic field and induces electrical energy in the pulse generating coil.

3. The energy generating system of claim 1, wherein the power generator includes a ferroelectric generator comprising:
a ferroelectric element,
an explosive charge, and
a detonator coupled with the explosive charge, wherein the detonator is configured to detonate the explosive charge to generate a shock wave that propagates at least partially through the ferroelectric element to generate electrical energy.

4. The energy generating system of claim 1, wherein the power generator includes a flux compression generator comprising:
a metallic armature,
an explosive charge positioned within the metallic armature, and
an inductance coil positioned surrounding the metallic armature and configured to induce a magnetic field in the metallic armature, wherein detonation of the explosive charge changes the magnetic field and induces electrical energy in the inductance coil.

5. The energy generating system of claim 1, wherein the voltage-controlled switch is a first voltage-controlled switch and is connected in series with one of the output terminals and further including a second voltage-controlled switch connected in parallel with the pair of output terminals, wherein closing of the first voltage-controlled switch transfers a first pulse of electrical energy to the output terminals and closing of the second voltage-controlled switch transfers a second pulse of electrical energy to the output terminals.

6. The energy generating system of claim 1, wherein the dielectric film is solid material.

7. The energy generating system of claim 1, wherein closing the voltage-controlled switch delivers electric current to a load coupled to the energy generating system with a closing time between approximately 100 picoseconds to approximately 500 picoseconds.

8. An energy generating system comprising:
a pair of output terminals to which a load is connected;
a ferromagnetic generator configured to generate a pulse of electrical energy; and
a voltage-controlled switch coupled to the power generator, wherein the voltage-controlled switch closes when the generated electrical energy pulse reaches a breakdown level and the switch transfers electrical energy to the output terminals, the voltage-controlled switch including:
a first output terminal and a second output terminal configured to couple the voltage-controlled switch to at least one component,
a first electrode and a second electrode coupled to the first output terminal and the second output terminal, respectively, and configured to possess a voltage therebetween, and
a dielectric film positioned between the first electrode and the second electrode and configured to become electrically conductive when the voltage between the first electrode and the second electrode reaches the breakdown level,
wherein one of the first electrode or the second electrode has an arcuate shape facing the dielectric film.

9. The energy generating system of claim 8, wherein the ferromagnetic generator includes:
a pulse generating coil,
an explosive charge, and
a ferromagnetic element configured to generate a magnetic field, the ferromagnetic element positioned within the pulse generating coil and in proximity to the explosive charge, such that detonation of the explosive charge decreases the magnetic field and induces electrical energy in the pulse generating coil.

10. An energy generating system comprising:
a pair of output terminals to which a load is connected;
a ferroelectric generator configured to generate a pulse of electrical energy; and
a voltage-controlled switch coupled to the power generator, wherein the voltage-controlled switch closes when the generated electrical energy pulse reaches a breakdown level and the switch transfers electrical energy to the output terminals, the voltage-controlled switch including:
   a first output terminal and a second output terminal configured to couple the voltage-controlled switch to at least one component,
   a first electrode and a second electrode coupled to the first output terminal and the second output terminal, respectively, and configured to possess a voltage therebetween, and
   a dielectric film positioned between the first electrode and the second electrode and configured to become electrically conductive when the voltage between the first electrode and the second electrode reaches the breakdown level,
   wherein one of the first electrode or the second electrode has an arcuate shape facing the dielectric film.

11. The energy generating system of claim 10, wherein the ferroelectric generator includes:
a ferroelectric element,
an explosive charge, and
a detonator coupled with the explosive charge, wherein the detonator is configured to detonate the explosive charge to generate a shock wave that propagates at least partially through the ferroelectric element to generate electrical energy.

12. An energy generating system comprising:
a pair of output terminals to which a load is connected;
a flux compression generator configured to generate a pulse of electrical energy; and
a voltage-controlled switch coupled to the power generator, wherein the voltage-controlled switch closes when the generated electrical energy pulse reaches a breakdown level and the switch transfers electrical energy to the output terminals, the voltage-controlled switch including:
   a first output terminal and a second output terminal configured to couple the voltage-controlled switch to at least one component,
   a first electrode and a second electrode coupled to the first output terminal and the second output terminal, respectively, and configured to possess a voltage therebetween, and
   a dielectric film positioned between the first electrode and the second electrode and configured to become electrically conductive when the voltage between the first electrode and the second electrode reaches the breakdown level,
   wherein one of the first electrode or the second electrode has an arcuate shape facing the dielectric film.

13. The energy generating system of claim 12, wherein the flux compression generator includes:
a metallic armature,
an explosive charge positioned within the metallic armature, and
an inductance coil positioned surrounding the metallic armature and configured to induce a magnetic field in the metallic armature, wherein detonation of the explosive charge changes the magnetic field and induces electrical energy in the inductance coil.

* * * * *